(12) United States Patent
Minotti

(10) Patent No.: US 7,824,958 B2
(45) Date of Patent: Nov. 2, 2010

(54) PROCESS AND SYSTEM FOR MANUFACTURING AN ENCAPSULATED SEMICONDUCTOR DEVICE

(75) Inventor: Agatino Minotti, Masculacia (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 172 days.

(21) Appl. No.: 12/167,790

(22) Filed: Jul. 3, 2008

(65) Prior Publication Data

US 2009/0011549 A1  Jan. 8, 2009

(30) Foreign Application Priority Data

Jul. 5, 2007  (IT)  .......................... TO2007A0489

(51) Int. Cl.
*H01L 21/44* (2006.01)
*H01L 21/48* (2006.01)
*H01L 21/50* (2006.01)

(52) U.S. Cl. ........................ 438/106; 438/112; 438/123; 438/127; 257/E21.267; 257/E21.499; 257/E21.502; 257/E21.503

(58) Field of Classification Search ................. 438/106, 438/112, 123, 124, 126, 127; 257/E21.267, 257/499, 502, 503

See application file for complete search history.

(56) References Cited

U.S. PATENT DOCUMENTS

| 4,003,544 | A | * | 1/1977 | Bliven et al. ................... 249/95 |
| 4,451,973 | A | * | 6/1984 | Tateno et al. ................... 29/827 |
| 4,888,307 | A | * | 12/1989 | Spairisano et al. ...... 264/272.17 |
| 2001/0045644 | A1 | | 11/2001 | Huang |

FOREIGN PATENT DOCUMENTS

WO  WO 2006/018671 A1  2/2006

* cited by examiner

*Primary Examiner*—David Nhu
(74) *Attorney, Agent, or Firm*—Lisa K. Jorgenson; James H. Morris; Wolf, Greenfield & Sacks, P.C.

(57) ABSTRACT

A process for manufacturing a semiconductor device envisages the steps of: positioning a frame structure, provided with a supporting plate carrying a die of semiconductor material, within a molding cavity of a mold; and introducing encapsulating material within the molding cavity for the formation of a package, designed to encapsulate the die. The frame structure is further provided with a prolongation element mechanically coupled to the supporting plate inside the molding cavity and coming out of the molding cavity, and the process further envisages the steps of: controlling positioning of the supporting plate within the molding cavity with the aid of the prolongation element; and, during the step of introducing encapsulating material, separating and moving the prolongation element away from the supporting plate.

19 Claims, 4 Drawing Sheets

PROCESS AND SYSTEM FOR MANUFACTURING AN ENCAPSULATED SEMICONDUCTOR DEVICE

CROSS REFERENCE TO RELATED APPLICATIONS

This application claims the priority benefit of Italian patent application number TO2007A000489, filed on Jul. 5, 2007, entitled "Process and System for Manufacturing an Encapsulated Semiconductor Device," which is hereby incorporated by reference to the maximum extent allowable by law.

BACKGROUND OF THE INVENTION

1. Field of the Invention

The present invention relates to a process and to a system for manufacturing an encapsulated semiconductor device; in particular, the ensuing treatment will make reference, without this implying any loss of generality, to the production by molding of a power package for a semiconductor device, of the full insulated type.

2. Discussion of the Related Art

Power semiconductor devices, for example power MOSFETs, are known that comprise a plastic package designed to encapsulate a die of semiconductor material integrating a corresponding integrated circuit, wherein the plastic package is commonly obtained by molding.

For example, FIG. 1a and 1b show a semiconductor device 1 (in particular a power device) encapsulated in a package 2, made of plastic material, for example epoxy resin, of the type known as JEDEC TO-220. The semiconductor device 1 comprises a die 3 of semiconductor material and a leadframe 4 set at least partially within the package 2 and designed to support the die 3 within the same package 2, and to provide the electrical connection towards the outside of the integrated circuit within the die 3. The leadframe 4 comprises: a metal plate (known in general as "die pad") 5, set entirely within the package 2 and having a top surface 5a, to which the die 3 is coupled (for example, via interposition of adhesive material); and a plurality of leads 6, for example three, which come out of the package 2. In a way not illustrated, the die pad 5 is made of a single piece with one of the leads 6 (in particular, with the lead set in a central position), consequently constituting an electrode of the semiconductor device 1, and the die 3 is connected electrically to the remaining leads 6 by means of bond wires, which extend from a respective contact pad, carried by a top surface of the die 3 not in contact with the die pad 5, and a respective lead 6. The package 2 moreover has a through hole 7 at an end portion thereof (opposite to the one from which the leads 6 come out), for coupling, for example, by means of a screw or rivet, of the semiconductor device 1 to a heat sink (not illustrated). In this regard, the die pad 5 transfers the heat generated in use by the circuit integrated in the die 3 towards the aforesaid heat sink.

Given the need to ensure a good transfer of heat towards the heat sink, and (at least in the case of insulated packages) to insulate the die pad 5 electrically from the outside of the package 2, during manufacture of the semiconductor device 1, and in particular of molding of the package 2, a controlled thickness of the encapsulating material of the package underneath the die pad 5 needs to be guaranteed (in particular of the material in contact with a bottom surface 5b of the die pad 5, opposite to the top surface 5a to which the die 3 is coupled). The thermal and electrical performance of the resulting semiconductor device 1 can vary even considerably according to the aforesaid thickness, which is markedly dependent on the technique for manufacturing the package 2, and in particular on the correct positioning of the leadframe 4 during the molding step. An incorrect alignment of the leadframe 4 with respect to the mold used for the formation of the package 2 can cause a degradation of the thermal performance (in terms of thermal resistance $R_{th}$) if thickness of the encapsulating material is greater than an upper specification limit (USL), or the exposure of the bottom surface 5b of the die pad 5 if thickness of the encapsulating material is considerably lower than a lower specification limit (LSL). If the aforesaid thickness is smaller than the lower specification limit, an inadequate flow of encapsulating material during molding may also occur, causing the creation of voids at the backside of the package 2.

In a known manner, according to the molding technique and the resulting structure of the package, power packages for semiconductor devices are divided into "full molded" and "full insulated." In both cases, the die 3 is entirely coated with the encapsulating material, but in full molded packages areas of exposed metal may remain (for example, portions of the die pad 5 may be accessible from the outside of the package 2), whereas in full insulated packages the total absence of exposed metal needs to be guaranteed. It is evident that, especially in the case of full insulated packages, the presence of an excessively thin layer of encapsulating material on the backside of the device can irreparably jeopardize its performance.

It is consequently necessary to arrange the leadframe 4 and keep it in a proper and pre-set position within a corresponding mold during the step of molding of the package 2, in particular during injection of the encapsulating material and its subsequent hardening (polymerization). In the past, a wide range of molding processes have been proposed, designed to address this need.

For example, one of the proposed techniques envisages the use of fixed pins (so-called "fixed-pin" technique), fixedly coupled to the mold, and such as to come to abut on opposed portions of the top and bottom surfaces of the die pad 5 within the molding cavity, thus keeping the die pad in a desired position upon closing of the mold. Once the molding step is terminated, as illustrated in FIG. 2, the package 2 has, however, voids 10, which leave the die pad 5 exposed, in positions corresponding to the ones occupied by the fixed pins during molding. This technique can consequently be used for the production of full molded packages, but not for the production of full insulated packages.

In the case where the production of a full insulated package is required, the process described previously can be completed with a final off-line step (i.e., one distinct from and subsequent to the molding step) of filling of the voids 10 left by the fixed pins, with an epoxy compound (commonly known as "potting"), which is subsequently cured. FIG. 3 shows the resulting semiconductor device 1, in which reference 11 designates the filling portions that totally close the voids 10. The resulting process suffers, however, from a series of drawbacks, amongst which: the longer duration of the manufacturing method; the need for additional equipment and the associated additional costs; and the possibility of occurrence of reliability problems due to the fact that the epoxy compound is a material "external" to the encapsulating material that forms the body of the package.

To overcome these drawbacks, an alternative molding method has been proposed, which envisages the use of retractable ejector pins. In detail, in an initial step, FIG. 4a, the leadframe 4 is inserted within a molding cavity 12 of a mold 13. An input channel (or gate) 14 is in fluid communication with the molding cavity 12 and enables the introduction of encapsulating material. The leadframe 4 is kept in a desired position by means of the use of retractable pins 15, which are brought into contact with the die pad 5 (as highlighted by the arrows in FIG. 4a) so as to abut on a respective top surface 5a or bottom surface 5b thereof. For this purpose, guides 16 are provided in the mold 13, and the retractable pins 15 can slide within the guides 16 by the action of suitable actuators (not illustrated). Subsequently (FIG. 4b), encapsulating material 17 is injected within the mold 13; the retractable pins 15 keep the die pad 5 in the proper position so as to guarantee the thickness required by specifications of the encapsulating material 17 on the backside of the package 2. Next (FIG. 4c), once the molding cavity 12 is entirely filled with the encapsulating material, but before it polymerizes, the retractable pins 15 are retracted and moved away from the die pad 5 (causing them to slide again in the guides 16, as indicated by the arrows in FIG. 4c). The pressure of injection of the encapsulating material 17 is then increased so that it comes to occupy the empty spaces left by the retractable pins 15, and subsequently the required compactness of the package is achieved by hardening.

This method enables formation of a full insulated package with a good accuracy of the thickness of the encapsulating material 17 on the back of the leadframe 4. However, it has the problem of rapid wear of the retractable pins 15 and of the corresponding guide within the molding cavity 12, due to the abrasive characteristics of the encapsulating material 17 used for the manufacturing of the package 2 (in general, epoxy resin containing an inorganic part, known as filler, with abrasive properties). This aspect has a negative impact both on the costs of production and on the quality of the devices thus produced.

SUMMARY OF THE INVENTION

One aim of the present invention is consequently to provide a process that enables the aforesaid disadvantages and problems to be overcome and in particular that enables a good precision in the control of the thickness of the encapsulating material to be obtained, as well as having reduced costs.

According to one aspect of the present invention, a process for manufacturing a semiconductor device is provided, comprising a process for manufacturing a semiconductor device, comprising: positioning a frame structure, provided with a supporting plate carrying a die of semiconductor material, within a molding cavity of a mold; and introducing encapsulating material within said molding cavity for the formation of a package, designed to encapsulate said die, wherein said frame structure is provided with a prolongation element, mechanically coupled to said supporting plate inside said molding cavity and coming out of said molding cavity, and by further comprising: controlling positioning of said supporting plate within said molding cavity with the aid of said prolongation element; and during said step of introducing encapsulating material, separating and moving said prolongation element away from said supporting plate.

According to another aspect of the present invention, a system for manufacturing a semiconductor device is provided, comprising a system for manufacturing a semiconductor device, comprising: a mold defining a molding cavity, designed to house a frame structure of said semiconductor device provided with a supporting plate carrying a die of semiconductor material; and an introduction unit for introduction of encapsulating material within said molding cavity for the formation of a package designed to encapsulate said die, wherein said frame structure is further provided with a prolongation element, mechanically coupled to said supporting plate inside said molding cavity and coming out of said molding cavity, and by further comprising: a positioning-control unit, configured to control positioning of said supporting plate within said molding cavity with the aid of said prolongation element; and an actuation unit, configured to separate and move said prolongation element away from said supporting plate during introduction of said encapsulating material.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION

Figure 1A:
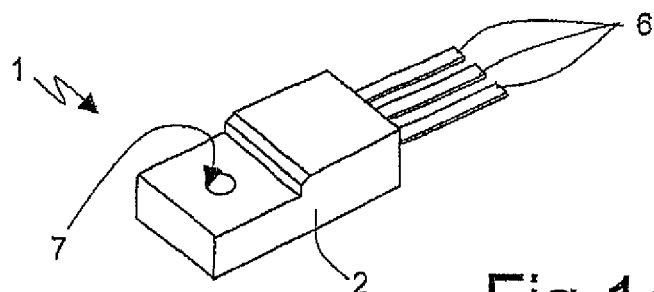
FIG. 1a is a schematic perspective view of an encapsulated semiconductor device of a known type.
Figure 1B:
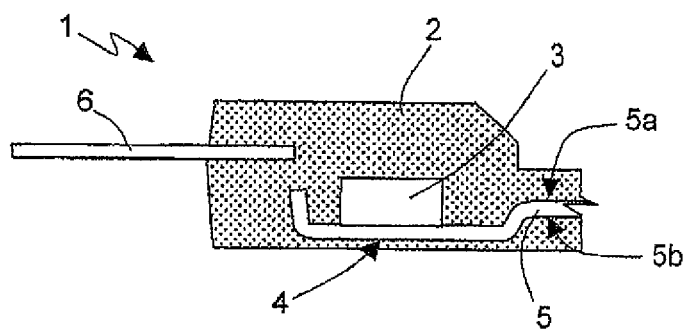
FIG. 1b is a cross-sectional view of the device of FIG. 1.
Figure 2:
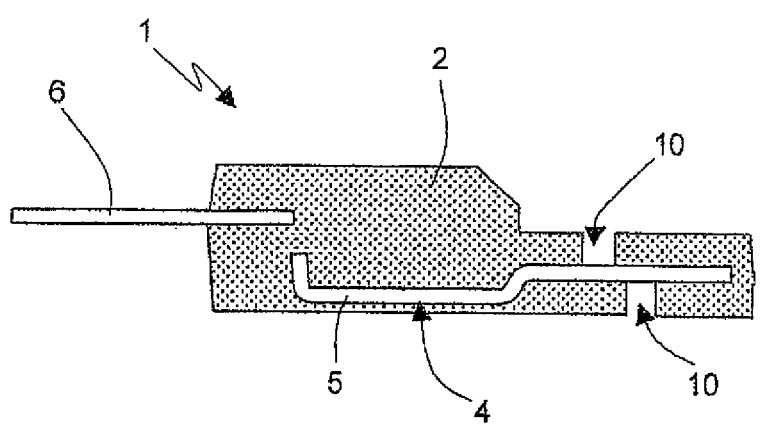
FIG. 2 is a cross-sectional view of a semiconductor device with full molded package of a known type.
Figure 3:
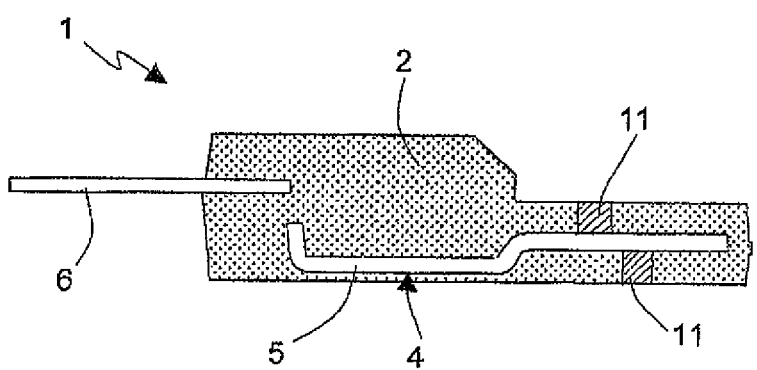
FIG. 3 is a cross-sectional view of a semiconductor device with full insulated package of a known type.
Figure 4A:
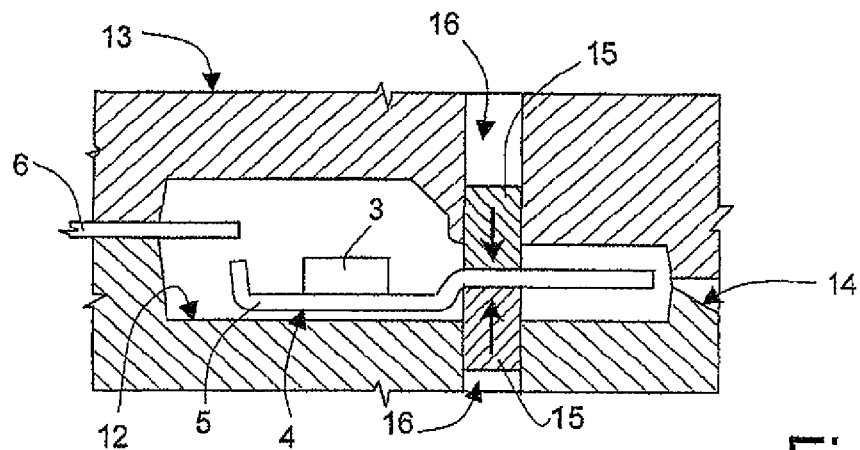
FIGS. 4a-4c show sections of a further semiconductor device with full insulated package of a known type, in successive steps of a corresponding molding process.
Figure 4B:
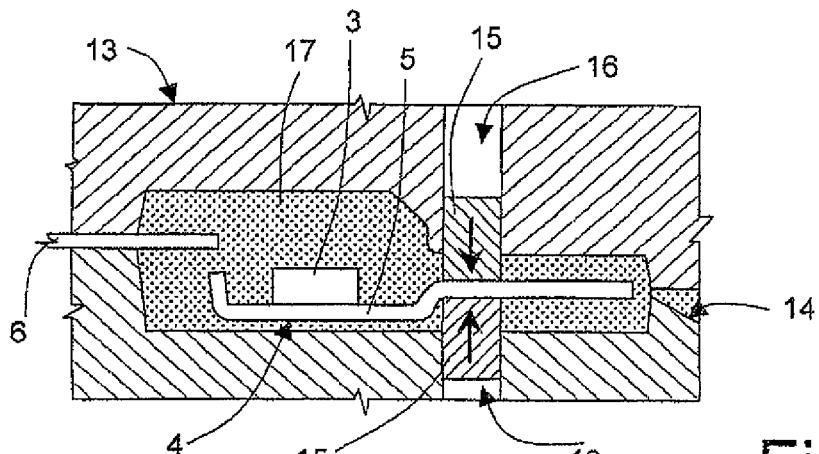
Figure 4C:
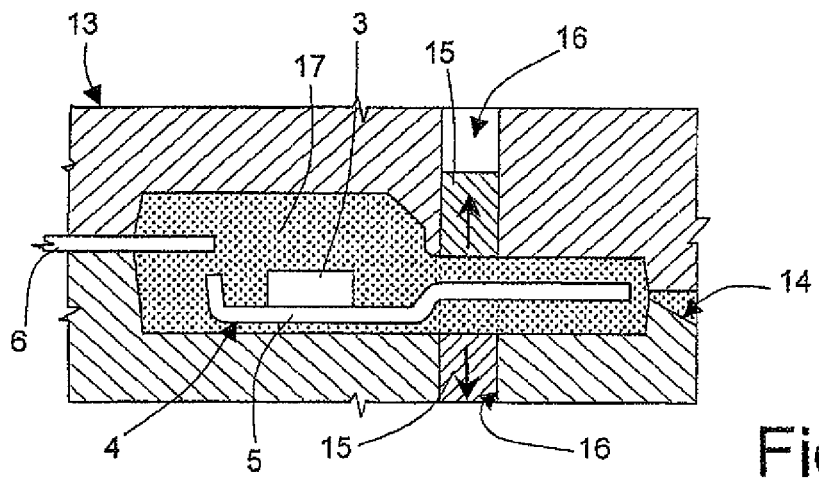
Figure 5A:
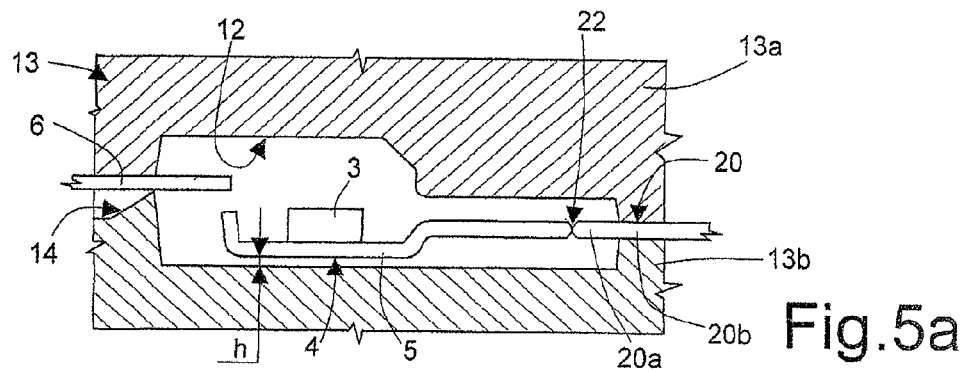
FIGS. 5a-5d show sections of an encapsulated semiconductor device in accordance with an embodiment of the present invention, in successive steps of a corresponding process for manufacturing by molding.

FIG. 5a relates to an initial step of a molding process for a semiconductor device according to an embodiment of the present invention. In this and in the subsequent figures, parts that are similar to other described previously will be designated with the same reference numbers, and will not be described again in detail. In particular, a leadframe 4 of the semiconductor device 1 is positioned within the molding cavity 12 of a mold 13 of a molding apparatus (of a known type that is not herein described in detail). The leadframe 4 comprises a die pad 5, arranged totally within the molding cavity 12, and a plurality of leads 6 (just one of which is illustrated in FIG. 5a), which come out of the molding cavity 12. Conveniently, the die pad 5 and the leads 6 have one and the same thickness, for example of a few millimeters, and are obtained by shaping and processing of one and the same ribbon of metal material, for example, copper.

The leadframe 4 further comprises a prolongation element 20 coupled to the die pad 5 inside the molding cavity 12 and coming out on the outside of the same molding cavity 12. In particular, the prolongation element 20 comprises a connection portion 20a, arranged within the molding cavity 12, and a grip portion 20b, arranged on the outside of the molding cavity 12. The connection portion 20a is mechanically connected to the die pad 5 at an area with facilitated breaking (facilitated breaking area 22). In a preferred embodiment, the prolongation element 20 is made of a single piece with the die pad 5 (in particular, starting from the same ribbon of metal material), and the facilitated breaking area 22 is an area of weakening of the same metal ribbon situated between the die pad 5 and the connection portion 20a. For instance, the facilitated breaking area 22 is obtained by means of removal of material and consequent reduction of the thickness of the aforesaid metal ribbon.

The grip portion 20b, which comes out of the molding cavity 12, enables positioning, in a desired way, the die pad 5 of the leadframe 4 during molding operations. In detail, both a first end of the die pad 5, connected integrally to the lead 6 coming out of the molding cavity 12, and a second diametrally opposite end of the same die pad 5, connected mechanically to the grip portion 20b, also coming out of the molding cavity 12, have a position established in a precise way by clamping, between a top half 13a and a bottom half 13b of the mold 13, of the leads 6 and grip portion 20b, respectively. The die pad 5 is hence correctly and stably positioned, in particular with an end portion thereof centered with respect to the molding cavity 12 of the mold 13, ensuring that a repeatable and accurate thickness of encapsulating material is obtained on the backside of the die pad 5 (this thickness is designated by h in FIG. 5a, and is indicated by the arrows).

Figure 5B:
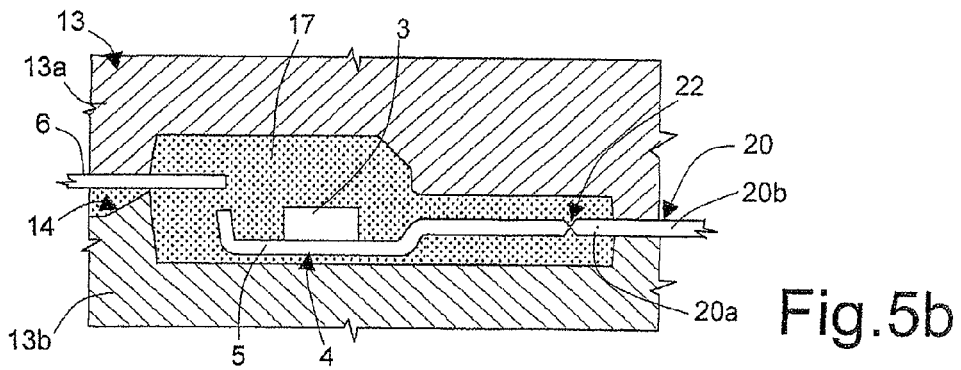

In a subsequent step of the molding process (FIG. 5b), the encapsulating material 17, in this case an epoxy resin (or other electrically non-conductive thermosetting plastic material), is injected under pressure within the molding cavity 12, through an input channel 14, set for example at the point where the leads 6 come out of the molding cavity 12. In this step, the molding cavity 12 is filled entirely with the encapsulating material, which has not, however, yet reached the desired compactness (the thermosetting process is still in progress).

Figure 5C:
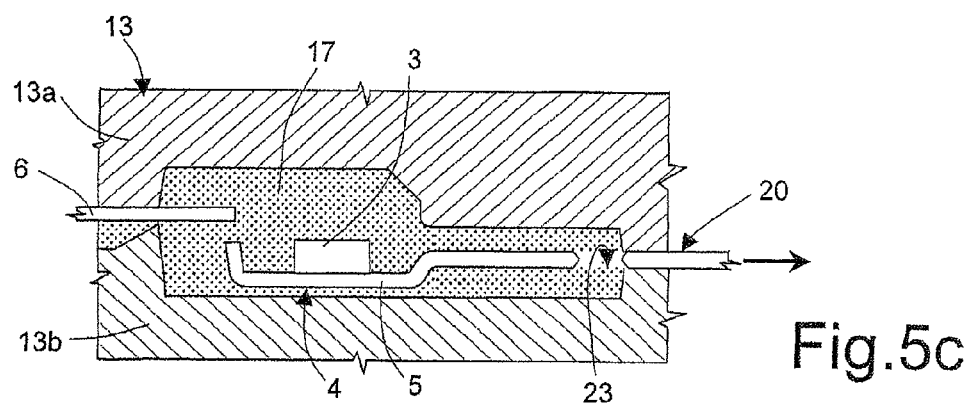

Next (FIG. 5c), the grip portion 20b is pulled mechanically, moving it away from the molding cavity 12 (in the direction indicated by the arrow), for example by means of an appropriate hydraulic actuator (not illustrated). This operation causes breaking of the facilitated breaking area 22, the separation of the connection portion 20a from the die pad 5, and the formation of an empty space 23, without encapsulating material, within the molding cavity 12. In this step, the prolongation element 20 is not removed altogether from the mold 13, but displaced until it is positioned exactly at the end of the molding cavity 12, closing it laterally (in other words, the displacement stops substantially when the connection portion 20a comes out entirely of the molding cavity 12). At this point, the transfer of the encapsulating material 17 continues so as to fill the empty space 23 previously occupied by the connection portion 20a, and then proceeds until the desired compactness is reached (completion of the polymerization process). During this step, the presence of the prolongation element 20 at the end of the molding cavity 12 prevents undesirable exit of the encapsulating material 17 from the molding cavity 12.

Figure 5D:
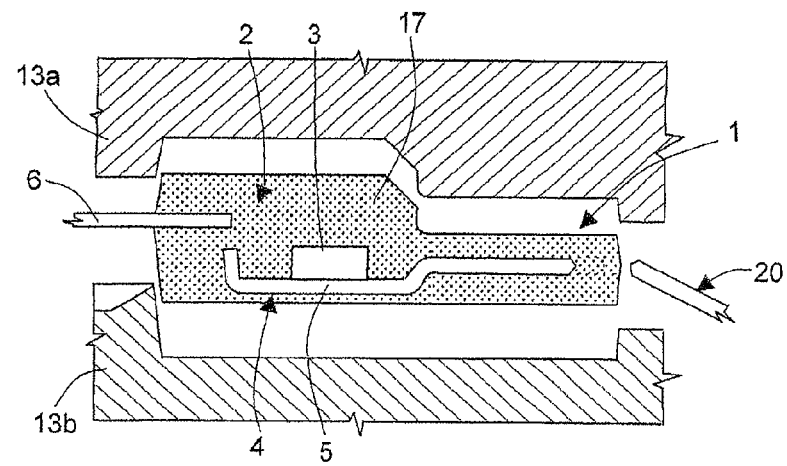

Next (FIG. 5d), once the process for molding of the package 2 of the semiconductor device 1 is terminated, the prolongation element 20 is fully removed from the molding cavity 12 and from the molding apparatus. The mold 13 is opened, separating the top half 13a from the bottom half 13b so as to enable extraction of the semiconductor device 1, which is now encapsulated and ready for subsequent processing steps.

Figure 6:
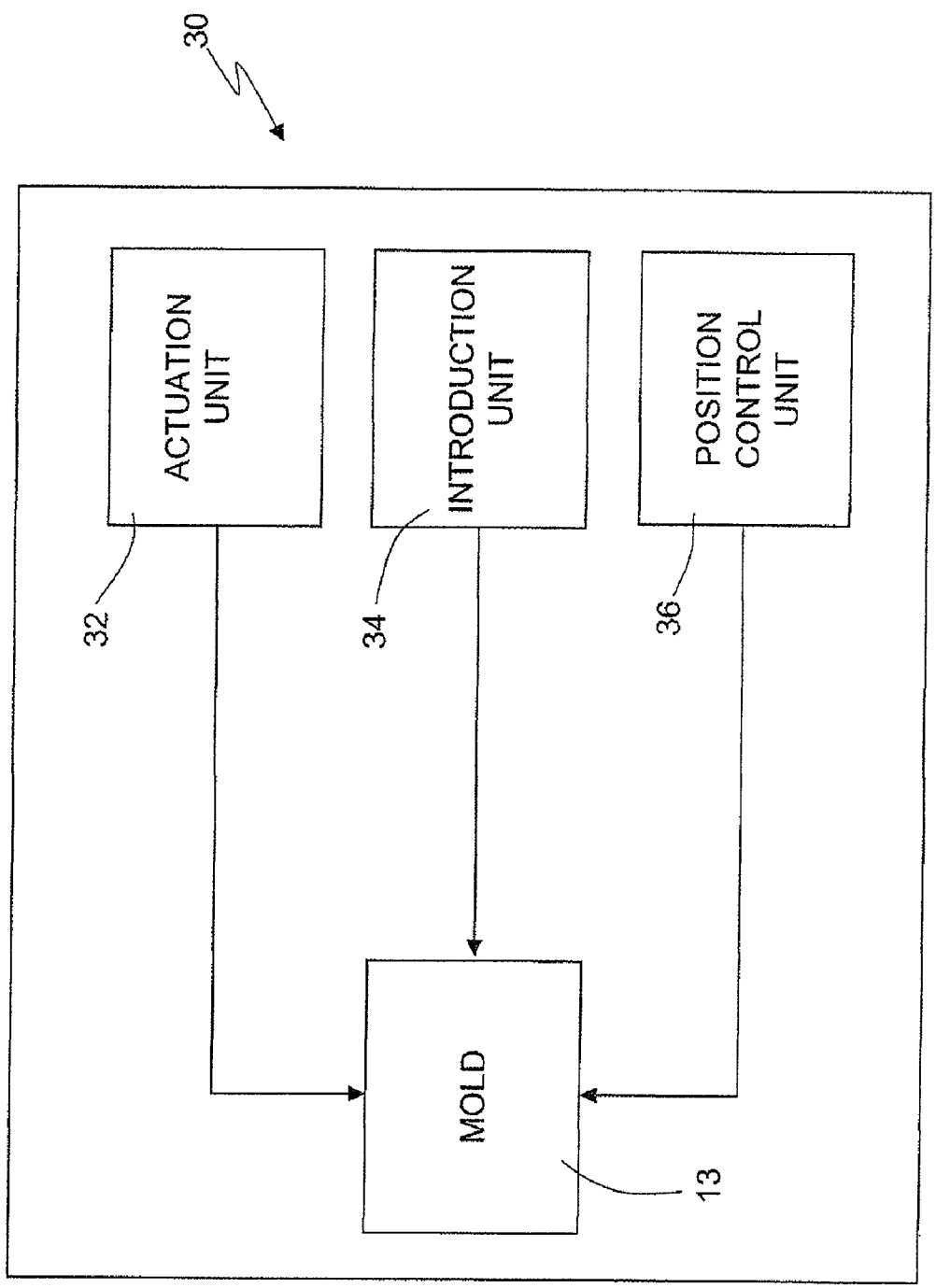
FIG. 6 is a simplified block diagram of a molding system according to a further embodiment of the present invention.

As illustrated in FIG. 6, a molding system 30 for implementation of the process previously described comprises: the mold 13, designed to receive the leadframe 4 and the corresponding die 3 for their encapsulation with the encapsulating material 17; an actuation unit 32, designed to co-operate with the leadframe 4 during the molding operations, and in particular to separate and move the prolongation element 20 away from the die pad 5; an introduction unit 34, designed to control introduction under pressure of the encapsulating material 17 within the molding cavity 12 of the mold 13; and a position-control unit 36, designed to co-operate with the prolongation element 20 for control of positioning of the die pad 5 within the molding cavity 12, during the initial steps of the molding process.

The process described has a number of advantages.

In particular, it enables a semiconductor device 1 to be obtained, which comprises a package 2 of a full insulated type, made up of just one plastic encapsulation material, in a simple and economically advantageous way (given that no additional equipment is required), without the drawbacks of the known art (and in particular without the disadvantages associated to the use of retractable ejector pins or the like, and with a better precision with respect to the use of fixed pins).

The process described ensures an accurate and controlled positioning of the leadframe 4 during molding, and consequently a repeatable and precise thickness of the encapsulating material 17 can be obtained on the backside of the package 2. Semiconductor devices 1 are thus obtained with pre-established and repeatable mechanical and electrical characteristics, preventing an increase in the defectiveness and a decrease in the performance.

Finally, it is clear that modifications and variations can be made to what is described and illustrated herein, without thereby departing from the scope of the present invention, as defined in the annexed claims.

In particular, the described process can be advantageously used with further types of packages, in which control of the thickness of the encapsulating material is required. For instance, it can be used with non-insulated packages, or with any type of package (also for signal applications, and not power applications) requiring a complete encapsulation of the leadframe in the compound of encapsulating material.

It is clear that different shapes can be envisaged for the package 2, as likewise there may be envisaged a different number of leads 6 (the same electrical connections between the die 3 and the leads 6 may vary).

Furthermore, the connection portion 20a of the prolongation element 20 may be mechanically coupled to the die pad 5 in a different way through a corresponding area with facilitated breaking, without being made of a single piece with the die pad; the molding method previously described remains in any case substantially unchanged.

What is claimed is:

1. A process for manufacturing a semiconductor device, comprising:
   positioning a frame structure, provided with a supporting plate carrying a die of semiconductor material, within a molding cavity of a mold; and
   introducing encapsulating material within said molding cavity for a formation of a package, designed to encapsulate said die,
   wherein said frame structure is provided with a prolongation element, mechanically coupled to said supporting plate inside said molding cavity and coming out of said molding cavity, and by further comprising:
   controlling positioning of said supporting plate within said molding cavity with an aid of said prolongation element; and
   during said step of introducing encapsulating material, separating and moving said prolongation element away from said supporting plate.

2. The process for manufacturing a semiconductor device according to claim 1, wherein said prolongation element is coupled to said supporting plate at a facilitated breaking area, said separating comprising breaking said facilitated breaking area.

3. The process for manufacturing a semiconductor device according to claim 2, wherein said prolongation element is made integrally with said supporting plate, and said facilitated breaking area corresponds to an area of weakening, set between said supporting plate and said prolongation element.

4. The process for manufacturing a semiconductor device according to claim 1, wherein said moving said prolongation element away from said supporting plate comprises forming an empty space without said encapsulating material within said molding cavity, placed in contact with said supporting plate; and said introducing encapsulating material further comprises filling said empty space.

5. The process for manufacturing a semiconductor device according to claim 4, wherein said encapsulating material comprises thermosetting material, in particular an epoxy resin; said step of introducing encapsulating material further comprising hardening said encapsulating material after said filling said empty space.

6. The process for manufacturing a semiconductor device according to claim 1, wherein said separating said prolongation element from said supporting plate comprises pulling said prolongation element from a grip portion thereof set on the outside of said molding cavity.

7. The process for manufacturing a semiconductor device according to claim 1, wherein said moving said prolongation element away from said supporting plate comprises extracting said prolongation element from said molding cavity.

8. The process for manufacturing a semiconductor device according to claim 7, wherein said extracting comprises bringing said prolongation element flush with an end of said molding cavity so as to close said molding cavity laterally; further comprising, after introducing encapsulating material, removing said prolongation element completely from said mold.

9. The process for manufacturing a semiconductor device according to claim 1, wherein said controlling positioning comprises clamping said prolongation element between a first half and a second half of said mold.

10. The process for manufacturing a semiconductor device according to claim 9, wherein said clamping comprises centering a portion of said supporting plate with respect to said molding cavity.

11. The process for manufacturing a semiconductor device according to claim 1, wherein said die is coupled to a top surface of said supporting plate; and said controlling positioning comprises controlling a thickness of said encapsulating material on a bottom surface of said supporting plate not in contact with said die.

12. The process for manufacturing a semiconductor device according to claim 1, wherein said semiconductor device is a power device, and said package is a power package, configured to coat and fully insulate said supporting plate and said die.

13. A process for manufacturing a semiconductor device, comprising:
   contacting a sacrificial portion of a positioning frame structure between portions of a separable mold to position other portions of the positioning frame structure, including a supporting plate and a die of semiconductor material mounted to a die pad of the frame structure, within a molding cavity of the separable mold;
   introducing encapsulating material to the molding cavity;
   positioning the other portions of the positioning frame structure, including the supporting plate and the die of semiconductor material, with encapsulating material introduced to the molding cavity; and
   separating the separable portion of the positioning frame structure from the other portions of the positioning frame structure at a separation joint positioned within the molding cavity while introducing encapsulating material to the molding cavity.

14. The process for manufacturing a semiconductor device according to claim 13, wherein contacting the sacrificial portion of the positioning frame structure includes clamping the sacrificial portion of the positioning frame structure between portions of the separable mold.

15. The process for manufacturing a semiconductor device according to claim 13, wherein separating the separable portions of the positioning frame structure includes pulling the separable portion of the positioning frame structure away from the other portions of the positioning frame structure.

16. The process for manufacturing a semiconductor device according to claim 15, further comprising:
   positioning the separable portion of the positioning frame structure, once separated from the other portions of the positioning frame structure, at an opening to the separable mold to prevent encapsulating material from escaping from the mold cavity.

17. The process for manufacturing a semiconductor device according to claim 13, wherein separating the separable portion of the positioning frame structure includes separating the separable portion of the positioning frame structure from the other portions of the positioning frame at a predetermined breaking region of the positioning frame structure.

18. The process for manufacturing a semiconductor device according to claim 13, wherein introducing encapsulating material includes introducing a thermosetting, encapsulating material.

19. The process for manufacturing a semiconductor device according to claim 13, further comprising:
   continuing the introduction of encapsulating material to the molding cavity to cover the separation joint of the other portions of the positioning frame structure with encapsulating material.

* * * * *

UNITED STATES PATENT AND TRADEMARK OFFICE
CERTIFICATE OF CORRECTION

| | |
|---|---|
| PATENT NO. | : 7,824,958 B2 |
| APPLICATION NO. | : 12/167790 |
| DATED | : November 2, 2010 |
| INVENTOR(S) | : Minotti |

It is certified that error appears in the above-identified patent and that said Letters Patent is hereby corrected as shown below:

On the title page, item (75) should read:
(75) Inventor: Agatino Minotti, Mascalucia (IT)

Signed and Sealed this
Third Day of May, 2011

David J. Kappos
*Director of the United States Patent and Trademark Office*